United States Patent [19]

Kihara et al.

[11] 4,443,808
[45] Apr. 17, 1984

[54] SEMICONDUCTOR DEVICE

[75] Inventors: Kazuo Kihara, Tokyo; Masashi Ikeda, Urawa, both of Japan

[73] Assignee: Tokyo Shibaura Denki Kabushiki Kaisha, Japan

[21] Appl. No.: 365,012

[22] Filed: Apr. 2, 1982

[30] Foreign Application Priority Data

Apr. 7, 1981 [JP] Japan .................. 56-52034

[51] Int. Cl.³ .................. H01L 29/48; H01L 29/72; H01L 27/02; H01L 29/34
[52] U.S. Cl. .................. 357/15; 357/34; 357/43; 357/46; 357/52; 357/88
[58] Field of Search .................. 357/15, 43, 46, 48, 357/34, 88, 52

[56] References Cited

U.S. PATENT DOCUMENTS 3,737,742  6/1973  Breuer et al. .................. 357/15 X
3,962,590  6/1976  Kane et al. .................. 357/15 X

FOREIGN PATENT DOCUMENTS 55-117273  9/1980  Japan .................. 357/15

OTHER PUBLICATIONS

Carballo et al., "Self-Contained Bipolar-FET Device", *IBM Tech. Discl. Bull.*, vol. 19, No. 11, pp. 4191–4192, Apr. 1977.
Gani et al., "Bilevel Dual Impedance Monolithic Structure", *IBM Tech. Discl. Bull.*, vol. 18, No. 5, p. 1407, Oct. 1975.

*Primary Examiner*—Martin H. Edlow
*Assistant Examiner*—J. L. Badgett
*Attorney, Agent, or Firm*—Finnegan, Henderson, Farabow, Garrett & Dunner

[57] ABSTRACT

A semiconductor device having a high breakdown voltage transistor and a Schottky barrier diode. The Schottky barrier diode is formed in a surface portion of a semiconductor layer adjacent to the base region of the transistor, and a well layer of the same conductivity type as and of a lower impurity concentration that of the aforementioned semiconductor layer is formed under the Schottky barrier diode.

5 Claims, 4 Drawing Figures

SEMICONDUCTOR DEVICE

BACKGROUND OF THE INVENTION

This invention relates to a semiconductor device having both a high breakdown voltage transistor and a Schottky barrier diode.

It is well known in the art that in a high speed logic circuit or a high frequency and large signal amplifier the saturation phenomenon of a transistor used in such a device is a factor for deteriorating the operation speed or frequency property of the device.

As a prior art method of preventing such saturation phenomenon of transistor, there is one in which a Schottky barrier diode is provided between the base and collector of a transistor. Meanwhile, in order to obtain a high breakdown voltage transistor it is necessary to set a large thickness of an epitaxial layer and a high resistivity thereof.

FIG. 1 shows an example of IC (integrated circuit) where a high breakdown voltage transistor, for instance a planar type bipolar transistor, and a Schottky barrier diode are assembled. In FIG. 1, on a P-type silicon substrate 1 is formed an N+-type buried layer 2, on which is formed an N⁻-type epitaxial layer 3. When this epitaxial layer 3 has a thickness $t_{VG}$ of 11 to 13μ and a resistivity $\rho_{VG}$ of 2 to 3 Ω.cm, the breakdown voltage $V_{CED}$ between the collector and emitter of the transistor is 30 V or above. In the N⁻-type epitaxial layer 3, P-type regions 5 and 6 serving as a base region of the transistor and a guard ring of the Schottky barrier diode are formed. A Schottky barrier diode 7 is formed in a surface portion of the N⁻-type epitaxial layer 3 surrounded by the P-type regions 5 and 6. The Schottky barrier diode 7 is formed by an aluminum-silicon contact, a platinum-silicon contact etc. Reference numeral 4 designates a silicon oxide film, 8 an electrode for the base of the transistor and the Schottky barrier diode, 9 the emitter electrode of the transistor, 10 the collector electrode of the transistor, 11 the P+-type layer as an isolation region, and 12 an N+-type layer as the emitter of the transistor.

With the semiconductor device of the above construction in which the N⁻-type epitaxial layer has a large thickness $t_{VG}$ and a high resistivity $\rho_{VG}$, the resistance of the N⁻-type epitaxial layer 3 that lies between the Schottky barrier diode 7 and base region of the transistor (P-type layer 5) on one hand and the N+-type burried layer 2 on the other hand is high. This resistance corresponds to the resistance of the resistance element connected in series with the Schottky barrier diode 7. Therefore, the CR time constant that is determined by the contact capacitance of the Schottky barrier diode, the base-emitter junction capacitance and the resistance of the aforementioned N⁻-type epitaxial layer 3 is large, and consequently the storage time is long. This means that it is impossible to obtain sufficient function of the clamping Schottky barrier diode assembled in the device for the purpose of permitting high speed operation of the device.

SUMMARY OF THE INVENTION

The invention is intended in the light of the above and has an object of providing a semiconductor device, which can prevent the saturation phenomenon of transistor and can reduce the storage time.

The semiconductor device according to the invention comprises a semiconductor substrate of a first conductivity type, a buried layer of a second conductivity type selectively formed on the semiconductor substrate, a semiconductor layer of the second conductivity type formed on the semiconductor substrate and buried layer, a first diffusion layer of the first conductivity type formed in the semiconductor layer, and a second diffusion layer of the second conductivity type formed in the first diffusion layer, a Schottky barrier diode being formed in a surface region of the semiconductor layer adjacent to the first diffusion region, a well layer of the second conductivity type of a higher impurity concentration than that of the semiconductor layer being formed at least under the Schottky barrier diode.

DETAILED DESCRIPTION OF THE PREFERRED EMBODIMENTS

Now, embodiments of the invention will be described with reference to the drawings.

Figure 1:
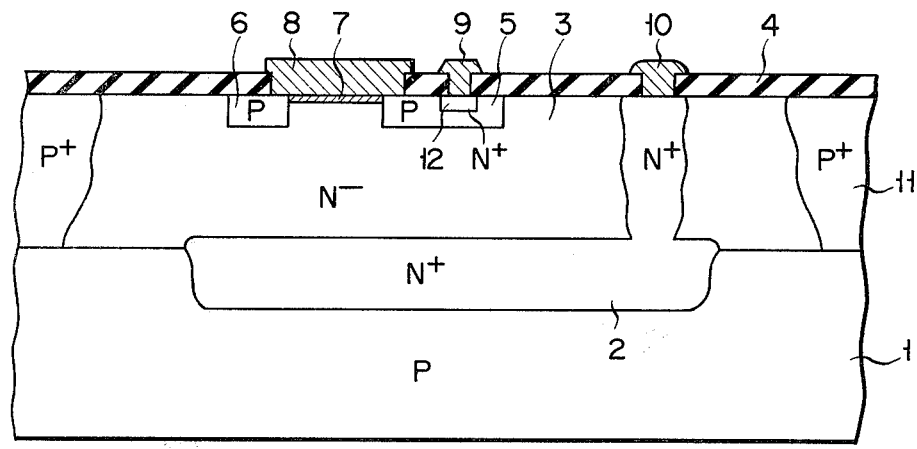
FIG. 1 is a sectional view showing a prior art semiconductor device having a high breakdown voltage transistor and a Schottky barrier diode.
Figure 2:
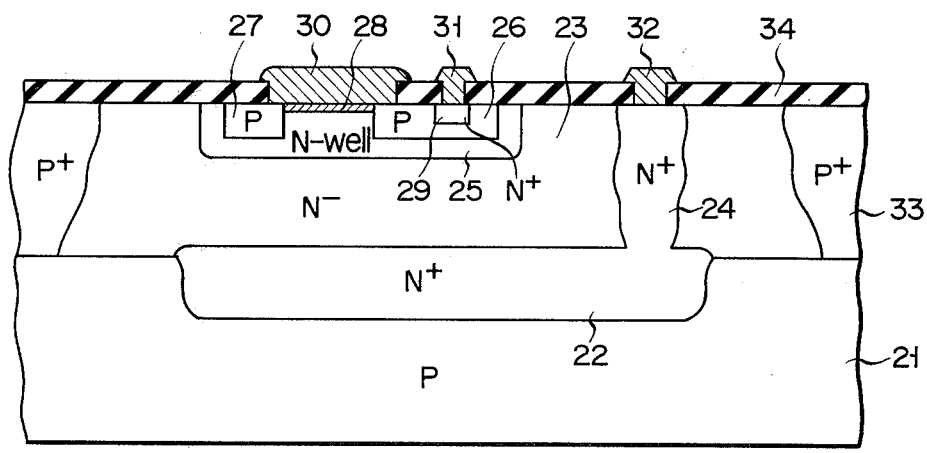
FIG. 2 is a sectional view showing a semiconductor device having a high breakdown voltage transistor and a Schottky barrier diode in one embodiment of the invention.

Referring now to FIG. 2, on a P-type silicon substrate 21 is selectively formed an N+-type buried layer 22, on which is formed an N⁻-type epitaxial layer 23. The N⁻-type epitaxial layer 23 has a thickness $t_{VG}$ of 11 to 13μ and a resistivity $\rho_{VG}$ of 2 to 3 Ω.cm. An N-type well layer 25 is formed in an upper portion of the N⁻-type epitaxial layer 23. P-type layers 26 and 27 serving as the base of a transistor and a guard ring of a Schottky barrier diode and a Schottky barrier diode 28 are formed in the N-type well layer 25. An N+-type layer 29 is formed as an emitter of the transistor in the P-type layer 26. An N+-type layer 24 as an extension of the N+-type layer 22 and a P+-type layer 23 acting as an isolation region are formed in the N⁻-type expitaxial layer 23.

On the surface of the semiconductor wafer having the above structure is formed an insulating film 34, for instance a SiO₂ film, and an electrode 30 for the base 26 and Schottky barrier diode 28, an emitter electrode 31 and a collector electrode 32 are formed in holes formed in the insulating film 34.

In the semiconductor device described above, the impurity concentration of the N-type well layer 25 is higher than that of the N⁻-type epitaxial layer 23, and its surface has such an impurity concentration that the Schottky barrier diode 28 can be formed. Preferably, the impurity concentration is less than $1 \times 10^{17}$ cm⁻³. The N-type well layer has a greater depth than the depth of the base diffusion.

Figure 3:
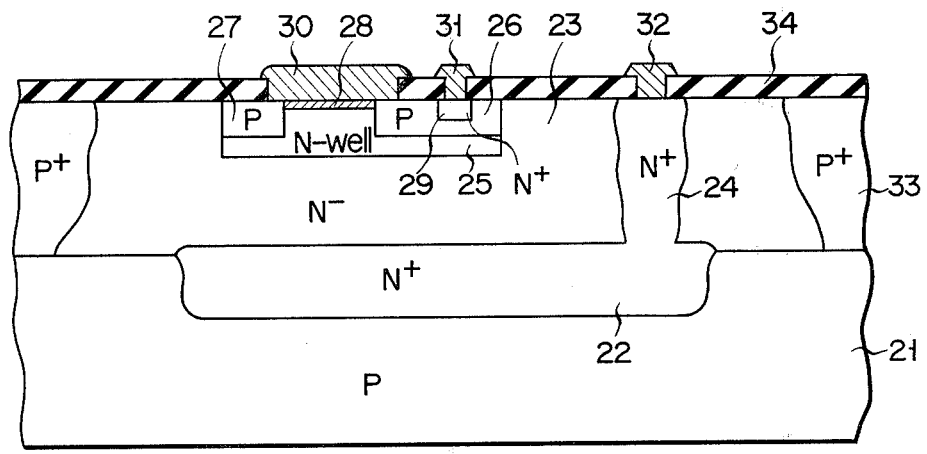
FIG. 3 is a sectional view showing a semiconductor device having a high breakdown voltage transistor and a Schottky barrier diode in a different embodiment of the invention.
Figure 4:
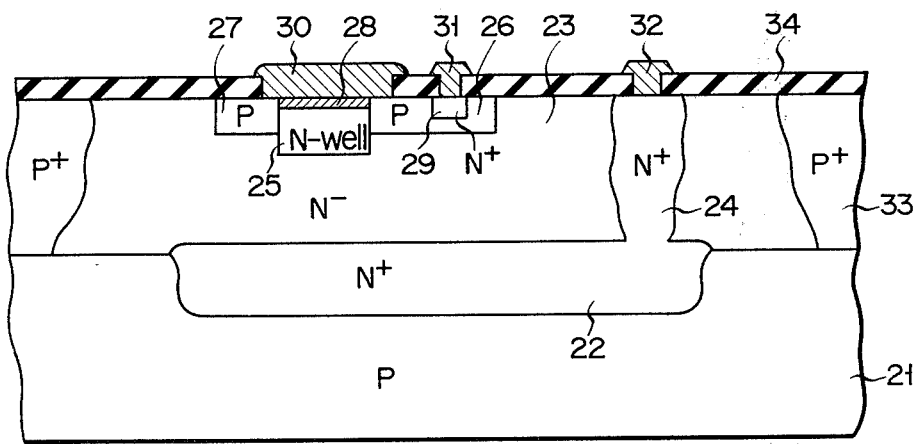
FIG. 4 is a sectional view showing a semiconductor device having a high breakdown voltage transistor and a Schottky barrier diode in a further embodiment of the invention.

In the structure shown in FIG. 2, the N-type well layer is formed to surround the P-type layers 26 and 27 and Schottky barrier diode 28. Although this arrangement is most preferred, it is by no means limitative. For example, the N-type well layer may extend along the entire bottom of the P-type layers 26 and 27 and Schottky barrier diode 28 as shown in FIG. 3, or it may extend along part of the P-type layers 26 and 27 and the bottom of the Schottky barrier diode 28. Alternatively, the N-type well layer need not extend along the P-type layers 26 and 27 as shown in FIG. 4. In general, the N-type well layer need be present only along the bottom of the Schottky barrier diode 28. The well layer may be formed by means of ion-implantation or thermal diffusion prior to the formation of the P-type layers 26 and 27.

As has been described in the foregoing, with the semiconductor device according to the invention since the well layer is formed right under the Schottky barrier diode, the resistance between the Schottky barrier diode and burried layer corresponding to the resistance of the resistance element connected in series with the Schottky barrier diode can be reduced. Thus, the CR time constant determined by the contact capacitance of the Schottky barrier diode, the base-collector junction capacitance and the resistance connected in series with the aforementioned Schottky barrier diode can be reduced to reduce the storage time. As has been shown, according to the invention it is possible to obtain a semiconductor device, which can prevent the saturation of a transistor and reduce the storage time.

What we claim is:

1. A semiconductor device comprising a semiconductor substrate of a first conductivity type, a buried layer of a second conductivity type selectively formed on said semiconductor substrate, a semiconductor layer of the second conductivity type formed on said semiconductor substrate and burried layer, a first diffusion layer of the first conductivity type formed in said semiconductor layer, and a second diffusion layer of the second conductivity type formed in said first diffusion layer, a Schottky barrier diode being formed in a surface region of said semiconductor layer adjacent to said first diffusion region, a well layer of the second conductivity type of a higher impurity concentration than that of said semiconductor layer being formed at least under said Schottky barrier diode.

2. The semiconductor device according to claim 1, wherein said well layer is formed under said Schottky barrier diode and under at least part of said first diffusion region.

3. The semiconductor device according to claim 1, wherein said well layer is formed to surround said Schottky barrier diode and said first diffusion region.

4. The semiconductor device according to claim 1, wherein said well layer has such an impurity concentration that said Schottky barrier diode can be formed.

5. The semiconductor device according to claim 4, wherein the impurity concentration of said well layer is less than $1 \times 10^{17}$ cm$^{-3}$.

* * * * *